United States Patent [19]
Jasinski et al.

[11] Patent Number: 4,597,949
[45] Date of Patent: Jul. 1, 1986

[54] APPARATUS FOR GROWING CRYSTALS

[75] Inventors: Thomas J. Jasinski, Medford; August F. Witt, Winchester, both of Mass.

[73] Assignee: Massachusetts Institute of Technology, Cambridge, Mass.

[21] Appl. No.: 481,097

[22] Filed: Mar. 31, 1983

[51] Int. Cl.⁴ .............................................. C30B 15/14
[52] U.S. Cl. ........................................ 422/249; 165/47
[58] Field of Search ............... 165/47 H; 156/617 SP, 156/DIG. 73; 422/249

[56] References Cited
U.S. PATENT DOCUMENTS 4,169,387 10/1979 Krempl ............................. 165/47 H
4,203,951 5/1980 Goriletsky ......................... 422/249

FOREIGN PATENT DOCUMENTS 2059932 4/1981 United Kingdom .

OTHER PUBLICATIONS

Ciszek, IBM Technical Disclosure Bulletin V17, No. 12, 426 9/74.

Primary Examiner—Hiram H. Bernstein
Attorney, Agent, or Firm—James E. Maslow; Thomas J. Engellenner

[57] ABSTRACT

An improved apparatus and method for growing crystals from a melt employing a heat pipe, consisting of one or more sections, each section serving to control temperature and thermal gradients in the crystal as it forms inside the pipe.

6 Claims, 2 Drawing Figures

APPARATUS FOR GROWING CRYSTALS

BACKGROUND OF THE INVENTION

The U.S. Government has rights in this invention pursuant to NASA Contract No. NSG-7645 and Army Contract No. DAA629-82-K-0119.

TECHNICAL FIELD

The present invention relates to crystal growth by pulling a seed crystal from a contacting melt or solution, normally referred to as the Czochralski method, and to crystals grown thereby.

Crystal pulling from a melt is at present the primary method for production of a variety of crystal materials of industrial importance (e.g., elemental and compound semiconductors such Si and GaAs, insulators such as $Al_2O_3$ and metals such as Cu) with diameters of up to and in excess of 7" and lengths up to and in excess of 7 feet. The term melt is used herein to mean both molten material to be crystallized and liquid solutions containing such materials; the melt may be bare or encapsulated by another fluid. A melt placed in an appropriate container is heated under an inert gas atmosphere to above its melting point by means of a heat source which may be a resistance, radio frequency or electron beam heater. With the molten charge at the desired temperature, a crystal seed of specified crystallographic orientation is contacted with the melt surface from above and the temperature is adjusted such that crystal-melt contact is maintained and melt solidifies onto the seed material at a desired diameter upon lifting of the seed crystal which is attached to a lifting device. During subsequent crystal pulling, the diameter of the crystal being pulled is increased or decreased as desired by appropriate adjustments of parameters such as melt temperature. In order to accomplish growth of materials which exhibit an excessive vapor pressure at the freezing point, the melt may be encapsulated with an immiscible inert fluid (of lower density than the melt) such as, for example, $B_2O_3$, and growth is conducted at ambient pressures in excess of the vapor pressure of the most volatile melt constituent.

It is a fact that even under optimized use of the controllable growth parameters, the conventional process of pulling crystals from a melt results in materials with crystalline and chemical perfection which is significantly less than theoretical. the material deficiencies can largely be attributed to lack of heat transfer control within the hot zone which gives rise to asymmetry in thermal field distribution within the melt and to uncontrolled and time varying axial and radial temperature distribution in the growing crystal.

More stringent property requirements in materials such as silicon and gallium arsenide, dictated by emerging device technology, have established a need for effective heat transfer control during melt growth of single crystals. In particular, there is a need to control the axisymmetric thermal gradients about the growth interface and along the growing crystal. There also is a need to increase the maximum pull rate at which constitutional supercooling effects can still be suppressed.

SUMMARY OF THE INVENTION

We have discovered that a simple, effective apparatus and method for controlling the temperature field in a growing crystal lies in a heat pipe based system of one or more independent sections surrounding the growing crystal. A heat pipe is an element constructed to provide an exceptional degree of temperature uniformity in both the axial and circumferential directions. In one preferred embodiment our heat pipe may comprise a tubular metal structure (i.e. stainless steel) with hollow walls having a network of passageways or "wicks", through which may pass a fluid medium, such as sodium or lithium, to conduct heat quickly from one portion to another and thus, maintain a uniformity of temperature in the heat pipe overall. In operation, the medium is nominally liquid and is evaporated where a hot spot occurs. The medium travels to a cooler portion of the pipe and condenses. Rapid heat transfer is accomplished by the large quantity of latent heat associated with changing the state of the medium.

In one aspect our invention comprises an improved crystal pulling device having a heat pipe which surrounds the growing crystal to provide a controlled radial thermal gradient and, hence, radial thermal symmetry in the crystal. In another aspect our heat pipe installed about the crystal may extend to almost the melt surface so as to provide controlled vertical and radial thermal gradients about the crystal growth interface.

In another embodiment our invention can take the form of a heat pipe with an auxiliary heating element connected thereto at its lower end but insulated from the heat pipe itself. The heating element is localized close to the three phase boundary in either an inert gas atmosphere or submerged in an encapsulating liquid and serves to alter the curvature of the growth interface from concave to planar or convex such that interface morphology-related defects in the crystal lattice can be maintained at a minimum. In liquid encapsulated systems the heat pipe may also be used to control the thickness of the encapsulating film about the crystal through its temperature dependent viscosity.

Our heat pipes can either function as heating units or cooling units so that the growing crystal is maintained at a precise, desired temperature. Two or more heat pipes can be employed together being separated, where necessary, by slowly insulating or conducting regions which can be used to provide a vertically variable but controlled thermal environment.

The heat pipe units may be independently heated or cooled by auxiliary heating or cooling systems. The temperatures of the independent heat pipes may be monitored by thermocouples and controlled by computer through programmed instructions. The heat pipe temperature and thus the crystal temperature can also be varied through vertical positioning of the heat pipe above the melt.

The invention will next be described in connection with various preferred embodiments; however, it should be clear that various changes and modifications can be made by those skilled in the art without departing from the spirit or scope of the claimed invention. For example, our invention may be employed in other crystal growing methods besides the Czochralski technique. Various means may be used to heat the melt. In fact, another heat pipe can be used about the crucible to assure uniform gradients in the melt. Axial position adjustments between the melt and the heat pipe can be accomplished by moving either the heat pipe or the crucible. A variety of encapsulating fluids can be employed and a wide range of crystal materials, such as Si, InP, GaAs, Ge, InsB, CdTe and PbSnTe among others can be grown in our apparatus.

The heat pipe itself can be constructed of stainless steel, nickle-based alloys sucg as INCONEL. molybdenum-based alloys such as MoW, or quartz, for examples. The wickling fluid may be sodium, lithium or mercury (for low temperatures), for examples. The wick structure may be a system of capillaries or a porous gauze. While an annular heat pipe is preferred for conventional Czochralski-grown crystals, other shapes may be preferred for other growth techniques, such as ribbon production.

DESCRIPTION OF THE PREFERRED EMBODIMENTS

Figure 1:
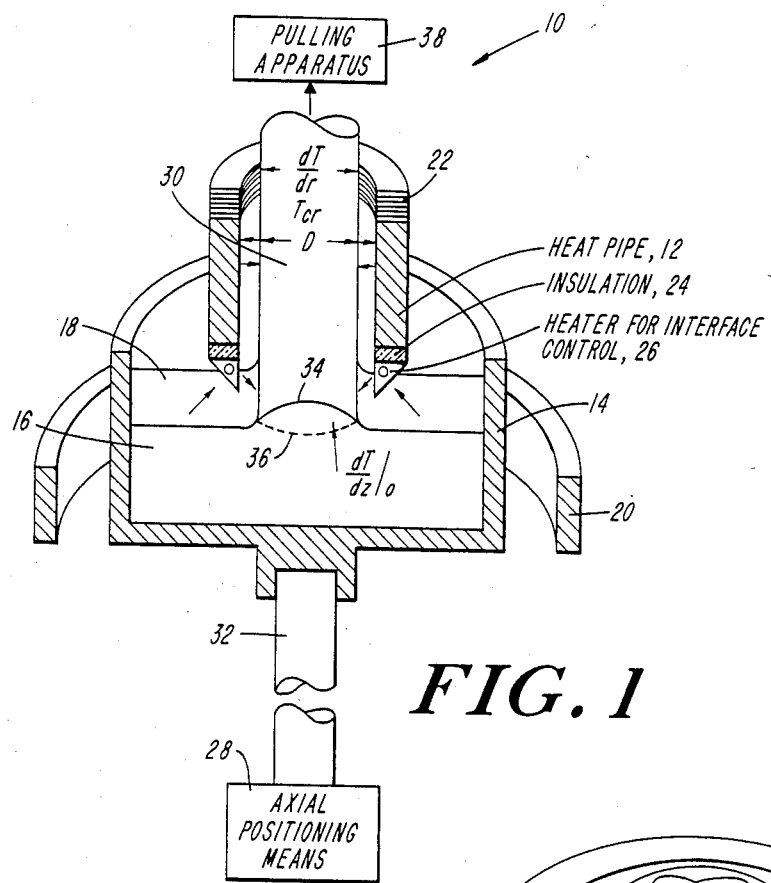
FIG. 1 is a partially cut-away, schematic view of the invention employing a single heat pipe.

In FIG. 1 an improved crystal growing apparatus 10 is shown comprising: a crucible 14 containing a melt 16 and an immiscible fluid 18, a circumferential crucible heater 20, a pulling apparatus 38 for pulling crystal 30 from the melt 16, a heat pipe 12 and a heating or cooling unit 22 connected to pipe 12 to control the temperature and the vertical thermal gradient of the growing crystal 30.

Additionally, the embodiment shown in FIG. 1 includes an auxiliary heating unit 26 immersed in the immiscible fluid 18 or located in the inert gas atmosphere, the auxiliary heating unit 26 being connected to the heat pipe 12 but insulated from the thermal action thereof by insulator 24. The position of the auxiliary heating unit 26 and heat pipe 12 relative to the melt can be adjusted by axial positioning means 28 connected to the crucible 14 by drive rod 32. Alternatively, the crucible can be kept stationary and the positions of the heating unit 26 and heat pipe 12 relative to the crucible 14 can be adjusted.

In operation fractured poly-silicon, for example, and predetermined amounts of dopant are placed into the crucible 14 and heated in an inert gas atmosphere of argon to above the melting point of silicon. After thermal equilibration, the melt 16 is contacted with an appropriately oriented (i.e., <111> or <100>) rod-shaped seed crystal attached to a rotating pulling apparatus 38. The melt temperature is subsequently adjusted so as to achieve some melt-back and the seed, under rotation, is lifted by the pull rod. With surface tension providing for seed-melt contact during pulling, the silicon crystal grows in length at the imposed rate of seed withdrawal. The desired diameter of the growing crystal is achieved and maintained by adjustments of the melt temperature, the pull rate and the rate of seed rotation. The heat pipe 12 which has an effective thermal conductivity exceeding that of copper by a factor of more than 10,000, is placed coaxially about the growing crystal 30. The heat pipe 12 precisely controls the temperature of the crystal 30 (up to about 1100 C.).

By employing the auxiliary heater unit 26, further control of the crystal-melt interface can be achieved. As shown by the solid line labelled 34 in FIG. 1 the crystal typically will present a concave surface to the melt. With heating unit 26 and heat pipe 12 a planar or even a convex interface as shown by the dotted line in FIG. 1 can be achieved. Since the gradient across the crystal-melt interface determines the maximum possible rate of growth as well as the stability of the growth interface, control of this gradient yields better lattice propagation through the growing crystal. The heat pipe 12 and heating unit 26 insure that thermal stress fractures are avoided and result in substantially improved thermal symmetry at growth interface. In certain instances unit 26 may be a cooling unit instead.

Figure 2:
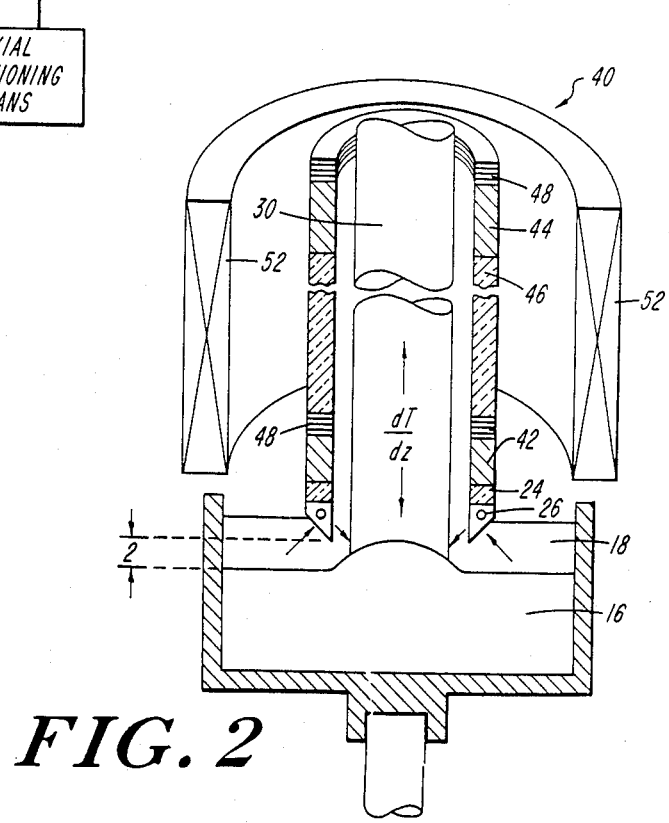
FIG. 2 is a partially cut-away, schematic view of the invention employing multiple heat pipe segments.

In FIG. 2 another embodiment of an improved crystal growing apparatus 50 is shown comprising multiple heat pipes surrounding the growing crystal 30. Section 44 can be maintained at a desired temperature by heating or cooling unit 48 while subsequent sections of the heat pipe such as section 42 are maintained at different temperatures. The sections are separated by insulating sections 46. In FIG. 2 a magnetic field-generating solenoid 52 is also shown situated about the crystal 30. The magnetic field may be employed together with our invention to further control the crystal growth. In operation a magnetic field is used to reduce convective fluid flows from turbulent to laminar as the crystal solidifies.

We claim:

1. An apparatus for improved crystal growth from a melt, wherein the crystal is pulled from a crystal-melt interface, the apparatus comprising
   at least one heat pipe surrounding at least a portion of the growing crystal as it is pulled from the melt;
   a temperature-adjusting element situated above and in close proximity to the crystal-melt interface, and
   a thermal insulation element disposed between the heat pipe and the temperature-adjusting element, whereby the temperature-adjusting element is thermally insulated from, and controlled independently of, said heat pipe to affect the shape of the interface and thereby reduce the formation of interface morphology-related defects in the crystals and the heat pipe cooperates with the temperature-adjusting element to further minimize defects by maintaining the surrounded crystal in thermal equilibrium.

2. The apparatus of claim 1 further comprising a heating unit to introduce heat into the heat pipe.

3. The apparatus of claim 1 further comprising a cooling unit to cool the heat pipe.

4. The apparatus of claim 1 wherein the apparatus further comprises a plurality of heat pipes.

5. The apparatus of claim 1 wherein the heat pipe is an annular heat pipe.

6. The apparatus of claim 1 wherein the apparatus further comprises an electrical means for generating a magnetic field within the growing crystal.

* * * * *